United States Patent
Singh et al.

(10) Patent No.: US 11,840,645 B2
(45) Date of Patent: Dec. 12, 2023

(54) CMP COMPOSITION FOR POLISHING HARD MATERIALS

(71) Applicants: ENTEGRIS, INC., Billerica, MA (US); UNIVERSITY OF FLORIDA RESEARCH FOUNDATION, INC., Gainesville, FL (US)

(72) Inventors: Rajiv K. Singh, Newberry, FL (US); Sunny De, Gainesville, FL (US); Deepika Singh, Newberry, FL (US); Chaitanya Dnyanesh Ginde, Gainesville, FL (US); Aditya Dilip Verma, Gainesville, FL (US)

(73) Assignee: ENTEGRIS, INC., Billerica, MA (US)

(*) Notice: Subject to any disclaimer, the term of this patent is extended or adjusted under 35 U.S.C. 154(b) by 166 days.

(21) Appl. No.: 17/163,372

(22) Filed: Jan. 30, 2021

(65) Prior Publication Data
US 2021/0238448 A1    Aug. 5, 2021

Related U.S. Application Data

(60) Provisional application No. 62/968,480, filed on Jan. 31, 2020.

(51) Int. Cl.
C09G 1/02          (2006.01)
H01L 21/321        (2006.01)
B24B 37/00         (2012.01)

(52) U.S. Cl.
CPC .............. C09G 1/02 (2013.01); B24B 37/00 (2013.01); H01L 21/3212 (2013.01)

(58) Field of Classification Search
CPC ....... C09G 1/02; B24B 37/00; H01L 21/3212; H01L 21/30625; C09K 3/1409; C09K 3/1463

USPC .................................... 438/693; 51/307–309
See application file for complete search history.

(56) References Cited

U.S. PATENT DOCUMENTS

| | | |
|---|---|---|
| 9,259,818 B2 | 2/2016 | Singh |
| 9,259,819 B2 | 2/2016 | Singh |
| 9,567,492 B2 | 2/2017 | Singh |
| 2002/0003225 A1* | 1/2002 | Hampden-Smith ........ H01G 4/0085 252/79.1 |
| 2004/0043702 A1 | 3/2004 | Singh |
| 2005/0104048 A1 | 5/2005 | Thomas |
| 2016/0060488 A1 | 3/2016 | Singh |
| 2019/0100677 A1 | 4/2019 | Cui |

(Continued)

FOREIGN PATENT DOCUMENTS

| | | | | |
|---|---|---|---|---|
| CN | 1334849 A | * | 2/2002 | ............ B24B 37/04 |
| CN | 1629238 A | * | 6/2005 | ............... C09G 1/04 |

(Continued)

OTHER PUBLICATIONS

Wikipedia, salt chemistry (Year: 1997).*

*Primary Examiner* — Duy Vu N Deo

(57) ABSTRACT

A slurry for chemical mechanical polishing (CMP) includes an aqueous liquid carrier, an oxygen and anion containing transition metal compound or polyatomic cations including a transition metal and oxygen or hydrogen, and a per-based oxidizer. The anion for the oxygen and anion containing transition metal compound can include oxynitrate, oxychloride, oxyhydroxide, oxyacetate, oxysulfide, or oxysulfate. The per-based oxidizer can be a permanganate compound.

9 Claims, 3 Drawing Sheets

(56) References Cited

U.S. PATENT DOCUMENTS

2019/0112506 A1* 4/2019 Ishibashi .............. C09K 3/1445
2020/0102479 A1   4/2020 Singh

FOREIGN PATENT DOCUMENTS

| CN | 102250552 A | 11/2011 |
| CN | 102260461 A | 11/2011 |
| JP | 2017063173 A | 3/2017 |
| JP | 2017179221 A | 10/2017 |
| TW | 201712083 A | 4/2017 |
| WO | 2012057941 A2 | 5/2012 |

* cited by examiner

CMP COMPOSITION FOR POLISHING HARD MATERIALS

CROSS-REFERENCE TO RELATED APPLICATION

This application claims priority to U.S. Provisional Patent Application No. 62/968,480, filed Jan. 31, 2020, the entire content of which is incorporated herein by reference.

TECHNICAL FIELD

This invention relates to chemical mechanical polishing (CMP) of hard materials, such as for fabricating integrated circuits (ICs) that comprise such hard materials.

BACKGROUND

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is often important to prepare a flat or planar microelectronic wafer surface prior to subsequent processing. Thus, it is necessary to planarize and/or polish certain surfaces of a microelectronic device wafer.

Chemical mechanical polishing or planarization ("CMP") is a process in which material is removed from a surface of a microelectronic device wafer, and the surface is planarized and polished by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not typically desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, patterning, etching and thin-film processing. In conventional CMP operations, a substrate carrier or polishing head is mounted on a carrier assembly and positioned in contact with a polishing pad in a CMP apparatus. The carrier assembly provides a controllable pressure to the substrate pressing the substrate against the polishing pad. The pad is moved relative to the substrate.

There is a need to improve the CMP polishing rate of hard materials such as diamond, carbides such as silicon carbide, nitrides such as gallium nitride and aluminum nitride, along with amorphous carbon, and their mixed compounds. Amorphous carbon may also have hydrophobic surfaces which makes chemical reactivity very difficult and thus manifesting lower removal rates during CMP. These materials may be used as dielectrics, etch stops, or related functions for integrated circuits (ICs) and other related applications. It is generally important that the overall friction of the CMP process is low and essentially no polishing defects are generated on the surface of the substrate. Furthermore, as the pressure and velocity during polishing is increased, there is a need to decrease the temperature rise during the polishing process. A reduced temperature rise during the polishing process makes the process more stable and reproducible.

SUMMARY OF THE INVENTION

In one embodiment, the invention provides a slurry for chemical mechanical polishing (CMP), comprising:
  an aqueous liquid carrier;
  a transition metal oxy compound chosen from oxy-nitrates, oxy-chlorides, oxysulfates, oxy-carbonates, and $C_2$-$C_{10}$ oxy-alkanoates; and
  a per-based oxidizer.

The slurry compositions of the invention are useful for the chemical mechanical polishing of various substrates, including diamond, carbides such as silicon carbide, nitrides such as gallium nitride and aluminum nitride, along with amorphous (hard and soft) carbon, graphite and their mixed compounds. Thus, also provided by the invention is a method for chemical mechanical polishing of such substrates. In one embodiment, the invention provides a high removal rate for amorphous carbon with selectivity over silica films, and in certain embodiments, reduce the net abrasive content in the slurry composition to very low amounts or even zero, still while achieving high removal rates.

DETAILED DESCRIPTION

Figure 1:
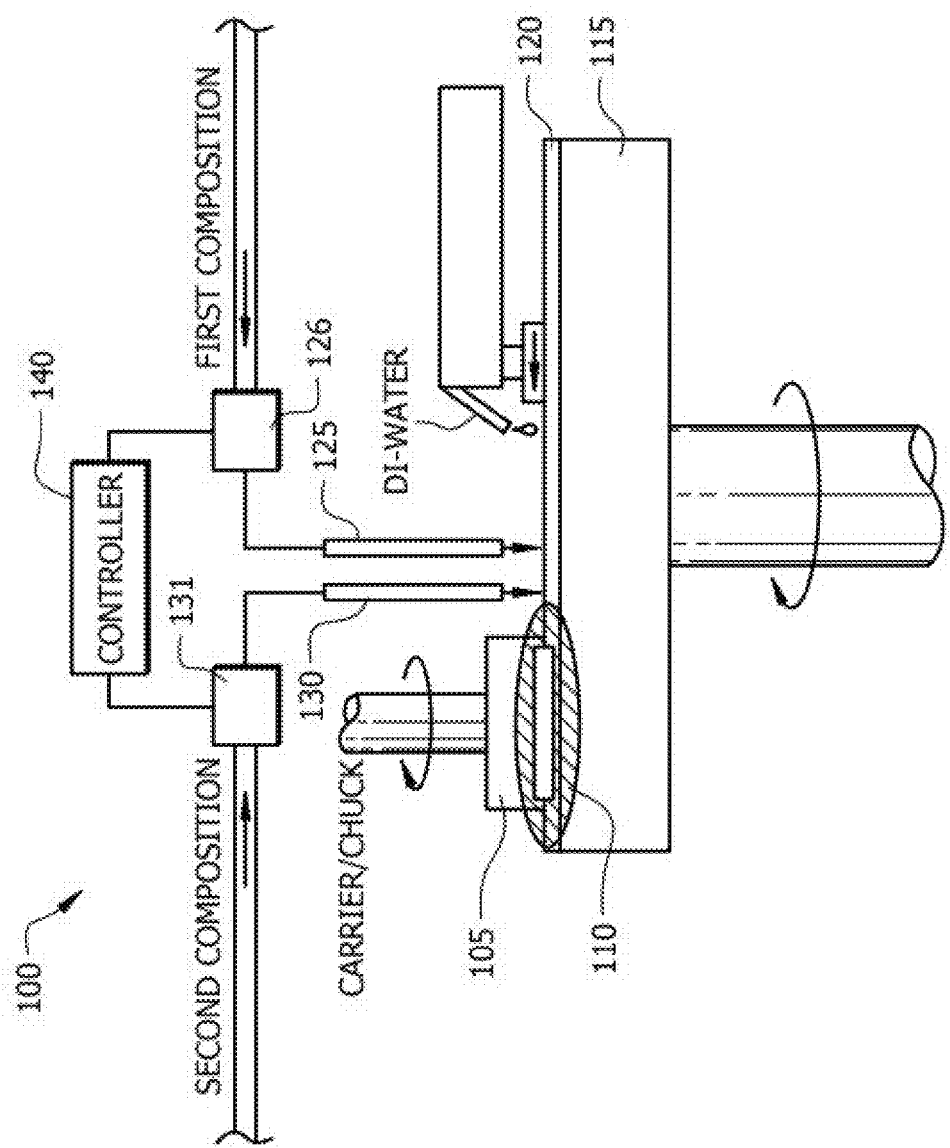
FIG. 1 depicts is a simplified depiction of a CMP apparatus that can be used with disclosed slurries and disclosed methods.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In a first aspect, the invention provides a slurry for chemical mechanical polishing (CMP), comprising:
  A. an aqueous liquid carrier;
  B. a. an oxygen and anion containing transition metal compound; or
     b. polyatomic cations comprising a transition metal and oxygen or hydrogen; or
     c. a transition metal oxy compound chosen from oxy-nitrates, oxy-chlorides, oxy-sulfates, oxy-carbonates, and $C_2$-$C_{10}$ oxy-alkanoates; and
  C. a per-based oxidizer.

In other words, the compositions comprise A; and at least one of B, a., b., or c; and C.

The aqueous liquid carrier referred to above comprises water.

In certain CMP processes, the slurry contains abrasive particles and an oxidizer such as potassium or sodium permanganate, hydrogen peroxide, or potassium persulfate, besides other additives. A permanganate is the general name for a chemical compound containing the permanganate (VII) ion, $MnO^{-4}$. Because manganese for permanganate is in the +7 oxidation state, the permanganate ion is a strong oxidizing agent. The term persulfate (sometimes known as peroxysulfate or peroxodisulfate) refers to ions or compounds containing the anions $SO_5^{2-}$ or $S_2O_8^{2-}$.

What is termed herein as a "cation to anion ratio", abbreviated herein as CAR is a ratio for an oxidizer having a general formula $C_aY_b$, where "C" represents a metallic cation and Y represents an anion. Examples of C include Group 1 alkali metals including Na, K, and Cs, and examples of Group II metals include calcium and barium and, containing either at least one carbon or one nitrogen atom, such as $NH_4^+$. Examples of Y include ions including nitrate ($NO_3^-$), halide, sulfate, sulfide, and oxide. The terms "a" and "b" as used herein refers to the # of units in the chemical formula of the cations and anions respectively.

The CAR for the oxidizer $C_aY_b$ is thus given by the following equation:

CAR=−1.0*[(a)*(oxidation number of cation C)]/[(b)*oxidation number of anion Y)].

The CAR value is typically 1 for alkali metal oxidizers of Group I such as Na, K, and Cs and Group II metal oxidizers such as calcium or barium. For the specific per-compound oxidizer case of $KMnO_4$ the oxidation number for anions is −1.0 and cation is 1.0, so that the CAR value=−1.0*(1*1.0)/(1*−1.0)=1.00. For calcium permanganate ($Ca(MnO_4)_2$), the oxidation number of the anion is −1.0, while that of cation is 2, so that the CAR value for calcium permanganate= −1.0*(1*2.0)/(2*−1.0)=1.00.

For per-compound oxidizers if some or all the alkali metal cations such as Na, K, or Ca is/are replaced by hydrogen ions, the general formula for the per-compound oxidizers $C_aY_b$ becomes $H_cC_{a-x}Y_b$, where 'c' and "x" are positive quantities greater than 0.01, and H refers to the hydrogen atom. To maintain charge neutrality c=(oxidation number of cation)*x. A Group I and/or a Group II cation can be replaced by a hydrogen ion using a disclosed cation replacing process, such as ion exchange, or another cation replacing process such as electrodialysis, or reverse osmosis. Thus, by replacing alkali metal cations (Group 1) or Group 2 cations in the per-compound oxidizer with hydrogen, the CAR value for the per-compound oxidizer can be reduced from 1 to less than 0.99. The higher the amount of replacement of cations with hydrogen, the lower the resulting CAR value.

The slurries of the invention can also include (c.) water-soluble ions of oxy compounds having a chemical formula $D_aO_dX_b$, where D refers to a transition metal such as Ti, Zr, Hf, Nd, Fe, Y, and Ni; O refers to oxygen; and X refers to anions such as nitrate, chloride, sulfate, sulfide, and oxide. Such oxy compounds can also be referred to as transition metal salts of oxy-chloride, oxy-nitrate, oxy-sulfate, oxy-sulfides, $C_2$-$C_{10}$ oxy-alkanoates, (such as oxy-acetate), oxy-butyrate, or a mixture thereof. Such oxy compounds can be used as precursors that upon dissolution generate polyatomic cations comprising a transition metal and oxygen and/or hydrogen. The quantities "a," "d," "b" are positive quantities. The water-soluble cations of such compounds are distinctly different from single atoms transition metal cations such as $Cu^+$, $Fe^{2+}$, or $Y^{3+}$, because they are at least diatomic and can be polyatomic in nature such as $D_aO_dH_b^{e+}$, where D refers to a transition metal cation, O refers to the oxygen atom, and H refers to hydrogen. The terms "a," "d" and "b" refers to positive quantities, and e+ refers to the charge of the soluble cation. Examples of soluble cations include $ZrO^+$, $ZrO^{++}$, $NiO^+$, $ZrOH^+$, $HfO^+$, $HfOH^+$, $TiO^+$, and $TiO^{++}$. Examples of such oxy compounds include, but are not limited to zirconium oxynitrate [$ZrO(NO_3)_2$], zirconium oxychloride [$ZrOCl_2$], nickel oxynitrate [$NiO(NO_3)_2$], nickel oxychloride [$NiOCl_2$], hafnium oxynitrate [$HfO(NO_3)_2$], hafnium oxychloride [$HfOCl_2$], zirconium oxysulfate [$ZrO(SO_4)$] and compounds having a formula $XO(C_nH_{2n-1}O_2)_2$ (where 'X' is a transition metal and 'n' may vary from 2 to 10), examples of which may include, but are not limited to, zirconium oxyacetate [$ZrO(C_2H_3O_2)_2$], zirconium oxybutyrate [$ZrO(C_4H_7O_2)_2$], zirconium oxycaprylate [$ZrO(C_8H_{15}O_2)_2$], $(NH_4)_2ZrO(CO_3)_2$; and the like.

Other embodiments (component c) also include water insoluble, partially or fully soluble hydrated metal oxides having a chemical of the form $DO_aH_b$ where D refers to a transition metal, and O and H refer to oxygen and hydrogen, respectively. Examples of hydrated oxides include, NiOOH, AlOOH, $Zr(OH)_4$, and ZrO(OH).

Other embodiments include a CMP slurry comprising an aqueous liquid carrier, and a partially or fully water-soluble oxy compound having a chemical formula $D_aO_dX_b$ that may in situ generate polyatomic cations of the form $D_aO_dH_b^{e+}$ (i.e., component b.), or amorphous insoluble hydrated amorphous transition metal oxide particles, mixed with a per-based oxidizer having a CAR value of 0 to 1. Optionally, the slurry can also contain other particles and/or surfactants that can be ionic (e.g., cationic, zwitterionic, anionic) or non-ionic surfactants. Optionally, the slurry can also be divided into two slurry components that can be mixed at an appropriate time so that there is not more than a predetermined time period between the mixing and the using for the polishing process, generally less than seven days.

Other embodiments also include a slurry for CMP comprising an aqueous liquid carrier, an oxygen and anion containing transition metal compound or a polyatomic cation comprising a transition metal and oxygen and/or hydrogen, (i.e., component a.), and a per-based oxidizer. The anion for the oxygen and anion containing transition metal compound can include oxynitrate, oxychloride, oxyhydroxide, or oxysulfate. The per-based oxidizer can be a permanganate compound. Examples of oxy and anion containing transition metal compound can comprise zirconium oxychloride, hafnium oxychloride, zirconium oxynitrate, or zirconium oxychloride. The slurry can optionally include abrasive oxide particles having a Mohs hardness of at least 5 comprising at least one of silica, zirconia, ceria, alumina, alumina-ceria, manganese oxide coated particles, and hydrated metal oxide particles.

Other embodiments also include a method of chemical mechanical polishing of a substrate comprising: providing a slurry that comprises a first component including an aqueous liquid carrier and at least one per-based oxidizer, and a second component including an aqueous carrier and an oxygen and anion transition metal compound or polyatomic cations comprising a transition metal and oxygen and/or hydrogen. As noted above, polyatomic cations may be formed by dissolution of oxy compounds, or by other compounds that act as precursors for polyatomic cations.

Polyatomic cations are generally not directly added to the slurry but are instead advantageously formed in the slurry solution. It is recognized herein that oxy compounds upon dissolution give rise to polyatomic cations and other compounds as well. The first and second components are mixed to form the slurry. A CMP apparatus exposes or rubs the substrate against a polishing pad on which the slurry is fed to remove at least a portion of a surface of the substrate. The waiting between the mixing and the using of the slurry can, in certain embodiments, be up to seven days, or longer. The substrate can comprise a hard substrate material such as silicon carbide, gallium nitride, diamond, or amorphous carbon. Other substrates include amorphous soft carbon and graphite.

In certain embodiments, the CMP polishing slurry composition includes one or more of the following: (i) a partially or fully water-soluble oxy compound having a chemical formula $D_aO_dX_b$, (ii) polyatomic cations of the form $D_aO_dH_b^{e+}$, and/or (iii) hydrated metal oxides which may be mixed with a permanganate-based oxidizer. The CAR value can be 0 to 1, such as 0.3 to 0.97, or less than 0.90, such as 0.20 to 0.90. It is noted that the CAR value can also be 0, such as for hydrogen permanganate that has a CAR value of 0.0. Hydrogen permanganate cannot be obtained commercially but can be generated using a disclosed cation replacement process.

For example, a CAR value below 1 can be achieved by processing the per-based oxidizer in which a Group I alkali metal or group II metal of a permanganate-based oxidizer are removed and replaced by hydrogen ions. The cation replacement processing can comprise an ion exchange process, electrodialysis or a reverse osmosis process. The alkali metals comprise the group 1 elements exclude hydrogen (H), where H is nominally a group 1 element but is not normally considered to be an alkali metal as it rarely exhibits behavior comparable to that of the alkali metals, and therefore H herein is not considered to be an alkali metal.

As noted above, the slurry can include soluble ions of oxy compounds having a chemical formula $D_aO_dX_b$, where D refers a transition metal such as Ti, Zr, Hf, Nd, Fe, Y, Ni, O refers to oxygen, and X refers to an anion such as a nitrate, chloride, sulfate, sulfide, or an oxide. The soluble ions of such compounds are distinctly different from single atom transition metal cations such as $Cu^+$, $Fe^{2+}$, $Y^{3+}$, because they can be polyatomic in nature such as $D_aO_dH_b^{e+}$ where D refers to transition metal cation, O refers to oxygen atom, and H refers to hydrogen. The terms "a," "d" and "b" refers to positive quantities and e+ refers to charge of the soluble cation. Examples of water-soluble cations include $ZrO^+$, $ZrO^{++}$, $NiO^+$, $ZrOH^+$, $HfO^+$, $HfOH^+$, $TiO^+$, $TiO^{++}$. The $D_aO_dH_b^{e+}$ cations can also be added separately. The concentration of oxy-compounds can range from 0.1 g/liter and 100 g/liter. The solubility of oxy compound can range from 10 part per million (ppm) to 100%.

A 'per-based oxidizer' as used herein includes an element in its highest oxidation state. Some per-compound oxidizers include transition metal compounds, such as permanganate ($MnO_4^-$), and some non-transition elements such as perchlorate ($ClO_4^-$).

Typical examples of per-compound types include permanganate, peroxide, perchlorate, and persulfate compounds. One particular per-compound type is an alkali metal (e.g., sodium, lithium, potassium, or barium) of permanganate, or a mixture of a per-compound with one component being a permanganate. Optionally, hydrogen permanganate can also be used.

Examples of specific per-based oxidizers include Potassium Permanganate ($KMnO_4$), sodium Permanganate ($NaMnO_4$), Potassium Perchlorate ($KClO_4$), Potassium Periodate ($KIO_4$), Potassium Perbromate ($KBrO_4$), Potassium Peroxide ($K_2O_2$), Potassium Peroxoborate ($KBO_3$), Potassium Peroxochromate ($K_3CrO_8$), Potassium Peroxodicarbonate ($K_2C_2O_6$), Potassium Peroxodisulfate ($K_2S_2O_8$), Potassium Perrhenate ($KReO_4$), Potassium peroxymonosulfate ($KHSO_5$), Potassium Ortho Periodate ($K_5IO_6 \cdot 2H_2O$), and Potassium peroxomonosulfate (or Peroxymonosulfate) ($K_2SO_5$). The oxidation state of manganese in these permanganates is +7, which is the highest oxidation state for manganese. Similarly, the oxidation state for chlorine in chlorate is +7, which is its highest oxidation state. The oxidation state of the transition metal or per-based oxidizer can be at least +3, or higher. Examples of +3 or higher oxidation state transition metals include $V^{3+, 4+, 5+}$, $Ti^{3+, 4+}$, $Cr^{3+, 6+}$, $Mn^{+3, 4+, 7+}$, $Fe^{3+}$, $Ni^{3+}$, $Co^{3+}$, $Mo^{3+, 4+, 5+, 6+}$, $Ru^{3+, 4+}$, $Pd^{4+}$, $Ta^{4+, 5+}$, $W^{6+}$, $Re^{4+, 6+, 7+}$, $Au^{3+}$, and $Zr^{4+}$. A mixture of per-compound oxidizers can also be used. The concentration of per-compound oxidizers can, in certain embodiments, vary from 0.01 M to 10 M or up to maximum solubility of the per-based compound at an elevated CMP temperature used (e.g., 70° C.), but is typically between 0.01 M and 0.5 M, such as between 0.1 M and 0.5 M.

For example, sodium or potassium cations can be replaced by hydrogen ions using an ion exchange process, electrodialysis, or reverse osmosis process. Another way to achieve a CAR≤0.99 is to add hydrogen permanganate $HMnO_4$ to the alkali metal-based permanganate solution. The replacement of the cations in the permanganate-based oxidizer solution by hydrogen ions leads to a decrease in pH of the permanganate-based oxidizer solution by at least by 1.0 unit of pH. For example, the pH of the permanganate-based oxidizer solution can decrease 8 units from 9.0 to 1.0. The pH range of alkali metal permanganate solution ranges from 0.1 to 12.0. but more typically ranges from 0.5 to 7.0, such as from 1.0 to 5.0, or from 1.1 to 4.0. Optionally, the slurry may contain a second per oxidizer such as peroxide, or persulfate. The operating pH of the slurry is generally from 0.5 to 13.0. A typical pH range for the slurry may be 0.8 to 5.0.

Optionally, a variety of surfactants can also be added to the slurries of the invention. As used herein, the term "surfactant" refers to an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. Surfactants can either be cationic, anionic, zwitterionic or non-ionic. The surfactants can be used individually or in a mixed state. A list of surfactants that can be used with the invention are provided in a book by M. J. Rosen, Surfactants and Interfacial Phenomena, John Wiley & Sons, 1989, hereinafter Rosen, on pages 3-32, 52-54, 70-80, 122-132, and 398-401. Further examples include, but are not limited to, amphoteric salts, cationic surfactants, anionic surfactants, zwitterionic surfactants, non-ionic surfactants, and combinations thereof including, but not limited to, decylphosphonic acid, dodecylphosphonic acid (DDPA), tetradecylphosphonic acid, hexadecylphosphonic acid, bis (2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid (DDBSA), other $R^1$ benzene sulfonic acids or salts thereof (where the $R^1$ is a straight-chained or branched $C_8$-$C_{18}$ alkyl group), dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, octadecylphosphonic acid (ODPA), dodecyl phosphate. Non-ionic surfactants contemplated include, but are not limited to, polyoxyethylene lauryl ether, dodecenylsuccinic acid monodiethanol amide, ethylenediamine tetrakis (ethoxylate-block-propoxylate) tetrol, polyethylene glycols, polypropylene glycols, polyethylene or polypropylene glycol ethers, block copolymers based on ethylene oxide and propylene oxide, polyoxypropylene sucrose ether, t-octylphenoxypolyethoxyethanol, 10-ethoxy-9,9-dimethyldecan-1-amine, Polyoxyethylene (9) nonylphenylether, branched, Polyoxyethylene (40) nonylphenylether, branched, dinonylphenyl polyoxyethylene, nonylphenol alkoxylates, polyoxyethylene sorbitol hexaoleate, polyoxyethylene sorbitol tetraoleate, polyethylene glycol sorbitan monooleate, sorbitan monooleate, alcohol alkoxylates, alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives, siloxane modified polysilazanes, silicone-polyether copolymers, and ethoxylated fluorosurfactants. Cationic surfactants contemplated include, but are not limited to, cetyl trimethylammonium bromide (CTAB), heptadecanefluorooctane sulfonic acid, tetraethylammonium, stearyl trimethylammonium chloride, 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide, di(hydrogenated tallow) dimethylammonium chloride, and polyoxyethylene (16) tallow ethylmonium ethosulfate. Anionic surfactants contemplated include, but are not limited to, poly(acrylic acid sodium salt), ammonium polyacrylate, sodium polyoxyethylene lauryl ether, sodium dihexylsulfosuccinate, sodium dodecyl sulfate, dioctylsulfosuccinate salt, 2-sulfosuccinate salts, 2,3-dimercapto-1-propanesulfonic acid salt, dicyclohexyl sulfosuccinate sodium salt, sodium 7-ethyl-2-methyl-4-undecyl sulfate, phosphate fluorosurfactants, fluorosurfactants, and polyacrylates. Zwitterionic surfactants include, but are not limited to, acetylenic diols or modified acetylenic diols, ethylene oxide alkylamines, N,N-dimethyldodecylamine N-oxide, sodium cocaminpropinate, 3-(N,N-dimethylmyristylammonio)propanesulfonate, and (3-(4-heptyl)phenyl-3-hydroxypropyl)dimethylammoniopropanesulfonate.

Examples of non-ionic surfactants includes (t-octylphenoxypoly-ethoxyethanol, Polyethylene glycol tert-octylphenyl ether, CAS No. 9002-93-1), sodium alkyl sulfonates (SAS), and sodium dodecylbenzene sulfonate (SDBS); cationic surfactants include ammonium bromides, while anionic surfactants include carbon containing sulfates and sulfonates. In certain embodiments, (i) the concentration of surfactants can vary from 0.001 times its critical micelle concentration (CMC) to 100 times its CMC; (ii) the number of carbon atoms in the surfactant can range from 6 to 20; (iii) the surfactant can be a fluorine containing surfactant, or a surfactant containing at least 8 carbon atoms, and/or (iv) the surfactant can be in a concentration from 0.1 gm/liter to 10 gm/liter.

The use of surfactants can decrease the friction during the polishing process. Another function of the surfactants is when mixed with oxy compounds is to provide a breakdown of an oxy compound into insoluble hydrous oxide compounds. Besides surfactants, the slurry can contain polymeric compounds such as PEG (polyethylene glycol), PAA (polyacrylic acid), PEO (polyethylene oxide). The concentration of these polymeric compounds can range from 1 ppm to 100,000 parts per million. These polymeric compounds also generally decrease the friction during polishing of a substrate.

Optionally, the slurry can contain abrasive particles. In certain embodiments, these abrasive particles will have a Mohs hardness of at least 3 or at least 5. It has been found however that added slurry particles are not essential to be in a disclosed slurry, because the slurry surprisingly works to provide a reasonable removal rate even on hard substrate materials without any added slurry particles. The abrasive particles can include diamond, metal oxides, nitrides, carbides, hydroxides, oxy hydroxides, or a mixture of these compounds. The metals include, silicon, boron, aluminum, and transition metals such as titanium, copper, manganese, zirconium, hafnium. Examples of particles include silica, alumina, zirconia, titania, manganese oxide, zinc oxide, yttria, and their mixtures. Other examples of particles include hydroxides, oxyhydroxides of transition metals such as aluminum, zirconium, cobalt, nickel, silica, manganese. Further abrasive particle examples also include hydrogen containing metal oxides such as AlOOH, $Zr(OH)_4$, ZrO(OH), and NiOOH. These compounds can be amorphous or crystalline. One aspect is the abrasive particles being coated with a thin layer (typically 0.1 nm to 1 μm thick) of manganese-based oxides or a hydrogen containing metal oxide abrasive. In another disclosed aspect, the slurry may contain coated particles comprising an outer first composition providing a coating to a core particle that comprises a second composition different from the first composition.

In certain embodiments, the average particle size of the abrasives can vary from 2 nm to 10 microns. The average size can be between 10 nm to 500 nm, or between 20 nm to 300 nm. The surface area of the particles can vary from 10 $m^2/gm$ to 200 $m^2/gm$. The porosity of the particles can vary from 0% to 90%. Due to the porosity the density of the abrasive particles can vary from up to 90% percent lower than the theoretical density of the particle. The theoretical density of the particles is obtained by assuming that there is no porosity of the particles. For example, if the theoretical density of the zirconia particles is 5.5 $gm/cm^3$, then the density of the porous zirconia particles should be less than 5.5 $g/cm^3$, such as less than 5.0 $g/cm^3$, or less than 4.5 $g/cm^3$. Similarly, if the theoretical density of silica particle is 2.60 $gm/cm^3$, the density of the porous silica particles is generally less than 2.34 $gm/cm^2$, such as less than 2.06 $gm/cm^3$. Similarly, if the theoretical density of alumina particles is approximately 3.95 $gm/cm^3$, the density of the porous alumina particles is less 3.55 $gm/cm^3$, such as less than 3.15 $gm/cm^3$. The shape of the particles can vary, such as being nearly spherical, to being faceted.

The pH of the iso-electric point (IEP) of the particles in the slurry is typically less than 7, such as 5, or less than 4. Abrasive particles such as zirconia, ceria, alumina, titania typically have IEP>5.0. But if these abrasive particles are coated with a thin layer of manganese oxide or dipped in permanganate solutions for an extended period of time (>2 days), the IEP values are reduced by at least 2.0 from the original IEP value. Thus, if the original value of the IEP of alumina particles was 9.0, this value can be reduced by at least 1 to 8 or below, such as to an IEP value of 5 or below. This can be achieved by either coating the alumina particle with manganese oxide surface or dipping the alumina particles in permanganate for at least 6 hours. Other oxide coatings such as a silica coating can decrease the IEP value to less than 5.0. The concentration of the particles can range from 0.1 weight percent to 40 weight percent, such as 0.1 weight percent to 20 weight percent, or 0.1 weight percent to 10 weight percent.

In certain embodiments, the substrates may be suitably polished without the presence of abrasive particles, or with reduced amounts of such particles in a range of from about 0.001% to about 3% by weight, or about 0.1% to about 1.5% by weight. In certain embodiments, the abrasive particle-free slurries are utilized with a permanganate oxidizing agent, which is observed to form manganese-based by-products at the surface of the polishing pad. Advantageously, hard and soft polyurethane pads having Shore D of about 30 to 80 can be utilized. Additionally, certain embodiments were found to remove hard amorphous carbon materials with high selectivity over silica films.

The abrasive particles for polishing can be chosen from silica, titania, zirconia or alumina particles. The average size of the silica particles generally range from 20 nm to 200 nm. The silica particle may be coated with a thin layer of manganese oxide coating, formed by a catalytic reaction of the permanganate ion in the slurry. The IEP of the coated silica particle is generally 3.0 or less. The titania particles generally have an average size of 500 nm or less, such as 200 nm or less, or 120 nm or less. The surface of the titania particles can be coated one or more layers of silica, alumina, manganese oxide, or hydrated oxide of silica, alumina, or manganese or one if its mixture. Depending on the nature of the coating, the IEP of the titania particle can vary from 2.0 to 9.0. When the abrasive oxide particles comprise zirconia or alumina and are coated with a silica or a manganese oxide surface, the IEP value can be 0.5 to 4.0. The coating thickness can vary from 0.4 nm to 1 micron. The coating can also be a metal oxide or can be an oxide containing hydrogen. The titania particle can either be amorphous, or be crystalline and comprise rutile or anatase, or comprise a mixed phase.

The zirconia particles can have average size range from 20 nm to 400 nm and have an amorphous, tetragonal or monoclinic phase. The porosity of the particles can range from 0.0% to 80%. The surface area of the particles can be 5 $m^2/gm$ or be higher such as 100 $m^2/gm$ or 200 $m^2/gm$. These particles can be coated with a thin layer of manganese oxide formed by breaking down the permanganate solution at pH 7 or below which has been found to generally occur naturally with time. With the breakdown of the permanganate the IEP value of the coated particle can become below 5.0, such as less than 4.0 or less or 3.0 or less. In a specific example, a zirconia particle has a monoclinic or amorphous structure with porosity greater than 10 percent and density less than 5.0 $gm/cm^3$. The surface area of the zirconia particles is 10 $m^2/gm$ or higher, such as 20 $m^2/gm$ or 30 $m^2/gm$ or higher, such as 100 $m^2/gm$ or 200 $m^2/gm$.

The alumina particle can generally be of any phase (alpha, beta, gamma, or delta) or its mixtures. The average particle size of the abrasives can vary from 10 nm to 1 micron. The alumina particles can be coated with a thin layer (typically a thickness greater than 0.4 nm) of hydrogen containing oxide materials such as AlOOH, $Zr(OH)_4$, ZrO(OH), MnOOH or with manganese oxides. The IEP of the aluminum oxide particle due to the coating can be reduced to less than 6.0, less than 5.0 or to less than 4.0, or between 0.5 to 4.0. The change in IEP is an indicator of the change in surface of the particle due to the particle coating process.

Optionally, the slurry may also include insoluble, partially or fully soluble hydrated metal oxide having a chemical of $DO_aH_b$ where D refers to transition metal, and O and H refer to oxygen and hydrogen respectively. Examples of hydrated oxides include NiOOH, AlOOH, and $Zr(OH)_4$, and ZrO (OH). The concentration of these hydrated oxide compounds can range from 0.1 gm/liter to 100 gm/liter.

The slurry compositions of the present invention contain soluble ions of the form $D_aO_dH_b^{e+}$. These cations are distinctly different from single atoms transition metal cations such as $Cu^+$, $Fe^{2+}$, $Y^{3+}$, because they can be polyatomic in nature such as $D_aO_dH_b^{e+}$ where D refers to transition metal cation, O refers to oxygen atom, and H refers to hydrogen. The terms "a," "d" and "b" refers to positive quantities and e+ refers to charge of the soluble cation. Examples of soluble cations include $ZrO^+$, $ZrO^{++}$, $NiO^+$, $ZrOH^+$, $HfO^+$, $HfOH^+$, and $TiO^+$. The concentration of these cations can range from 0.01 gm/liter to 20 grams/liter. The pH of the slurry in this disclosed aspect can be less than 7.0, such as less than 5.0, such as between 0.5 to 4.0. Additionally, Zirconium ions formed with $C_2$-$C_{10}$ oxy-alkanoic acids [e.g., $[ZrO(C_nH_{2n-1}O_2)_2]$, wherein n is an integer from 2 to 10], which can be termed as $C_2$-$C_{10}$ oxy-alkanoates, can be utilized for controlling temperature rise and polishing rates during polishing. Examples of such $C_2$-$C_{10}$ oxy-alkanoates include oxy-acetate, oxy-propionate, and oxy-oxalate. Thus, examples include Zirconium Oxyacetate $[ZrO(C_nH_{2n-1}O_2)_2]$, wherein n=2; zirconium oxypropionate $[ZrO(C_nH_{2n-1}O_2)_2]$, wherein n=3, etc.

In one embodiment, silicon carbide (SiC) can be polished with disclosed slurries. SiC can comprise a single crystal (4H, 6H, cubic), or be polycrystalline or amorphous in nature. During polishing of a single crystal SiC surface, the SiC single crystal surface can be exposed to the "Si" face, or the "C" face. The grain size of polycrystalline materials can vary from 10 nm to 200 μms. Other materials that can be polished by disclosed slurries include graphite, GaN, Diamond, AlN, other nitrides (e.g., AlGaN) and their mixtures. Other materials that can also be polished with disclosed slurries include carbon containing materials such as graphene, and carbon nanotubes.

In another embodiment, the slurries of the invention can be utilized to polish amorphous carbon. In this regard, certain embodiments of such slurries comprise the following:
  a) water;
  b) a per-based oxidizer; and
  c) at least one compound, which forms a cation in solution chosen from $ZrO^+$, $ZrO^{++}$, $NiO^+$, $ZrOH^+$, $HfO^+$, $HfOH^+$, $TiO^+$, and $TiO^{++}$; and
  wherein the pH is about 1 to about 5.

In certain embodiments, the per-based oxidizer is chosen from potassium permanganate and sodium permanganate. Such per-based oxidizers are in one embodiment generally present in a range of from about 0.01 weight percent to about 10 weight percent. In another embodiment, they are present in a range of about 0.5 to about 5, or about 1 weight percent. It will be appreciated that as noted above, the listing of cations in c. above are formed in situ in the aqueous liquid-based carrier by the utilization of compounds such as oxy compounds having a chemical formula $D_aO_dX_b$, where D refers to a transition metal such as Ti, Zr, Hf, Fe, Y, and Ni; O refers to oxygen; and X refers to anions such as nitrate, chloride, sulfate, sulfide, and oxide.

In certain embodiments, the compound of component c above is chosen from zirconium oxynitrate, zirconium oxychloride, nickel oxynitrate, nickel oxychloride, hafnium oxynitrate, hafnium oxychloride. In one embodiment, the compound of component c above is zirconium oxynitrate or zirconium oxychloride, zirconium oxysulfate, and zirconium oxyacetate.

In one embodiment, the pH is about 1.5 to about 2.5, or about 2.

During polishing using a slurry of the invention, the hard material on the wafer surface is rubbed by a polishing pad generally comprising a polymeric, metallic or a ceramic material with the hard material having a relative velocity with respect to the polishing pad. This relative velocity can vary from 0.01 m/sec to 100 m/sec with a typical velocity range of 0.2 m/s to 4 m/s. The pressure during CMP can range from 0.2 psi to 20, such as from 1 psi to 15 psi.

Examples of polymeric pads include polyurethane-based pads, and other polymeric materials that generally all have a Shore D hardness of less than 100, such as less than 70, or between 10 and 60. The density of the polishing pads can vary from 0.4 gm/cm$^3$ to 1.0 gm/cm$^3$.

FIG. 1 is a simplified depiction of an example CMP apparatus 100 that can be used with disclosed slurries and methods that includes a process controller 140 for implementing delivering onto the surface of a wafer 110 a first chemical composition and delivering a second chemical composition different from the first chemical composition. Apparatus 100 includes a polishing head 105 for holding the wafer 110, and a polishing pad 120 on the platen 115 operable to polish the surface of the wafer 110 using the slurry. The process controller (e.g. microprocessor or microcontroller) 140 is communicably coupled to the first and second control valves 126, 131.

A first inlet 125 including at least one control valve 126 is for delivering a first composition component and a second inlet 130 including at least a second control valve 131 is for delivering a second composition component. The slurry may contain a second per oxidizer such as a peroxide, or a persulfate. The operating pH of the slurry is generally from 0.5 to 13.0. A typical pH range for the slurry is generally 0.8 to 5.0. The two composition components can be mixed in a POU (point of use) tank and can be kept for less than 14 days, such as less than 5 days, or less than 24 hours. Although the CMP apparatus 100 is shown having two inlets, it is also generally possible to have all the slurry components to be introduced through a single inlet.

One of the challenges recognized herein for polishing with the above-described slurry is the chemical breakdown of the permanganate-based oxidizer if all the components are mixed together for an extended period of time. The breakdown time for the permanganate-based oxidizer can extend from minutes to several days. Thus, for optimal polishing using a disclosed slurry, the components that when together can result in a breakdown of the permanganate-based oxidizer can be separately stored, and then mixed shortly before using the slurry for the polishing process.

Figure 2:
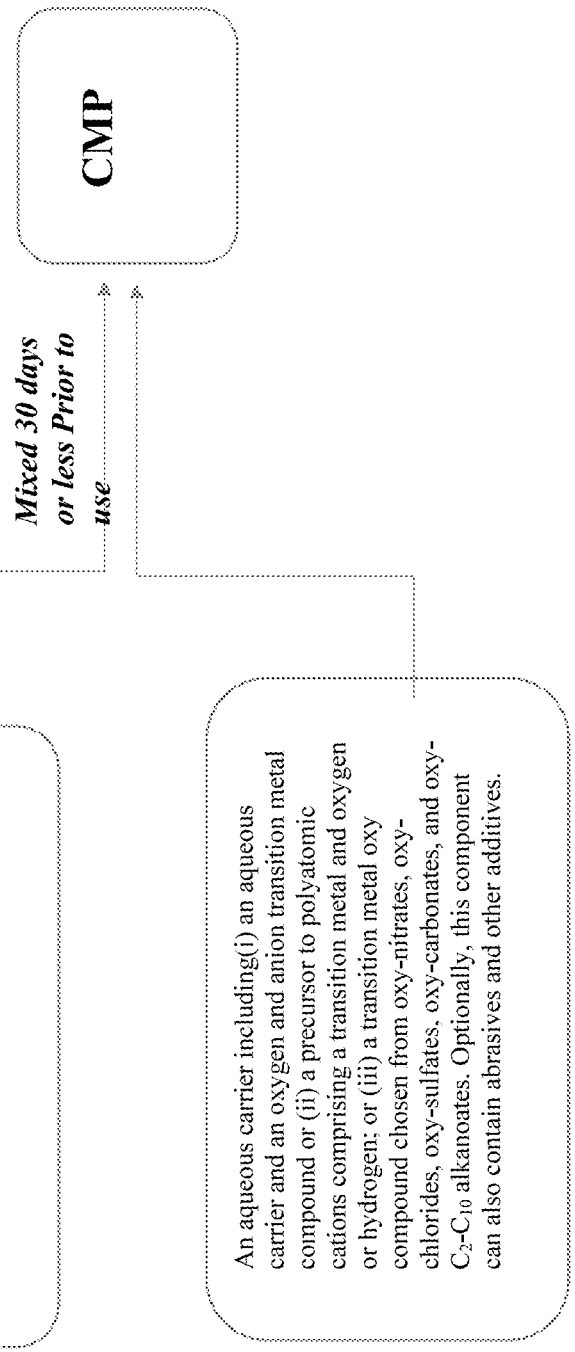
FIG. 2 depicts a mixing procedure for mixing a first component and a second component to form a disclosed slurry prior to use in a CMP process.

A schematic diagram of such a component mixing operation is shown in FIG. 2. The slurry is broken in at least two components. The first component shown as component 1 can include a permanganate-based oxidizer, and optionally can also include abrasive particles having a Mohs hardness of 5 or higher. The pH of the first component ranges from 1.0 to 13.0. The second component shown as component 2 can contain (i) an aqueous carrier and an oxygen and anion transition metal compound or (ii) a precursor to polyatomic cations comprising a transition metal and oxygen or hydrogen; or (iii) a transition metal oxy compound chosen from oxy-nitrates, oxy-chlorides, oxy-sulfates, oxy-carbonates, and $C_2$-$C_{10}$ oxy-alkanoates.

the oxygen-including transition metal compound and water, with the oxygen-including transition metal compound generally comprising an oxy-compound containing the transition metal having a formula $D_aO_dX_b$, along with optionally (b) a surfactant or a (c) precursor for polyatomic cations having the formula $D_aO_dH_b^{e+}$. The concentration of the oxy compound, surfactants and the precursor for the polyatomic cations can range from 0.1 gm/liter to 100 gm/liter. These first and second components can be mixed for a period not exceeding 30 days before being fed to the CMP apparatus. The period between mixing before using the slurry for CMP can be less than 14 days, such as less than 7 days, less than 1 day, less than 12 hours, or less than 6 hours.

EXAMPLES

Disclosed embodiments are further illustrated by the following specific Examples, which should not be construed as limiting the scope or content of disclosed embodiments in any way.

Example 1

A SiC single crystal n-doped wafer was polished using a Buehler CMP machine at a pressure of 4 psi and at 160 rpm. The wafer was polished on its silicon face. The slurry contained different concentrations of permanganate oxidizer and oxy compounds (containing a transition metal, oxygen and anion) having a chemical formula $D_aO_dX_b$, where D refers to transition metal such as Zr or Hf, and X refers to nitrate or chloride anions. Other transition metals such as hafnium, titanium, manganese, copper, nickel, bismuth, iron, manganese can be substituted for "D." For "X" other anions such as sulfate, oxide, hydroxide can also be substituted. Other oxy compounds include FeOOH, CoOOH, MnOOH, MnO(OH)$_2$, Fe$_2$O(SO$_4$)$_2$, Cu$_2$Cl(OH)$_3$, and BiClO. The dissolution of oxynitrate or oxychloride which contain oxygen and an anion and a transition metal in solution can result in the formation of $D_aO_dH_b^{e+}$ ions, where ZrO$^{2+}$, ZrO(OH)$^+$ are formed during dissolution if the transition metal is zirconium. Similarly, the dissolution of titanium oxysulfate leads to the formation of TiO$^{2+}$ ions. Other examples of oxygen and hydrogen containing polyatomic cations include NiO$^+$, CuO$^+$, and HfO(OH)$^+$.

The concentration of either zirconium oxychloride or zirconium oxynitrate was varied from 0.01 gm/liter to 100 gm/liter. The removal rate and the temperature rise on the pad and the surface roughness of the wafer was measured during the polishing process. The temperature on the polishing pad was measured by an infrared thermometer. The concentration of permanganate was varied from 0.01 M to 1.0 M. The pH of the slurry solution can be adjusted by adding nitric acid and/or an alkali. The pH can be varied from 0.5 to 5.0, such as between 1.5 to 4.0. The flow rate of the slurry was 30 ml/minute. For the experiments performed, the pressure was varied from 0.5 psi to 10 psi, while the rpm was varied from 20 rpm to 600 rpm. The temperature rise on the polishing pad was measured by infrared thermometer. A CAR value for the potassium permanganate oxidizer was chosen to 1.0 for these experiments.

Metrics measured included (i) removal rate, (ii) temperature rise, (iii) surface roughness and (iv) scratches on the surface, which were all monitored. The surface roughness was measured over an area of 5 micron×5 micron using an atomic force microscope (AFM). The ratio of removal rate and temperature rise has been defined as RRTR provides a parameter on the ability of the slurry to polish at high rates with minimum temperature rise. The higher the RRTR value the higher is ability of the slurry to reach high removal rates with a fixed temperature rise. Table 1 displays all these parameters.

The RRTR (in (nm/hr)/K)=removal rate (nm/hr)/temperature rise (K) is also shown in Table 1 shown below. The table also includes another parameter called the finish quality per unit removal rate (abbreviated as FQPURR). This quantity provides a value of the surface finish normalized to the removal rate. The lower the value of FQPURR the faster the slurry can reach the optimal surface roughness. As the removal rate is decreased by decreasing the concentration of the permanganate, the surface finish is expected to improve (become smoother). Table 1 also displays the FQPURR values obtained.

TABLE 1

| $KMnO_4$ Conc. (M) | Zirconium Oxy-nitrate (gm/L) | Zirconium Oxy-chloride (gm/L) | ph | MRR (nm/hr) | $\Delta T$ (K) | RRTR (nm/hr · K) | Surface Finish (nm) | FQPURR (hr)* 1000 |
|---|---|---|---|---|---|---|---|---|
| 0.01 | 0.0 | 0 | 1.0 | 342 | 10.3 | 33.20 | 0.12 | 0.34 |
| 0.01 | 0.3 | 0 | 1.5 | 512 | 10.1 | 50.69 | 0.11 | 0.22 |
| 0.05 | 0.0 | 2 | 2.6 | 980 | 10.9 | 89.91 | 0.13 | 0.13 |
| 0.20 | 0.0 | 0 | 2.0 | 630 | 15.6 | 40.38 | 0.14 | 0.21 |
| 0.20 | 2.0 | 0 | 2.0 | 1395 | 15.8 | 88.29 | 0.13 | 0.09 |
| 0.20 | 2.0 | 0 | 4.0 | 1255 | 15.5 | 80.97 | 0.13 | 0.11 |
| 0.20 | 0.0 | 0 | 9.0 | 220 | 12.8 | 17.19 | 0.14 | 0.64 |
| 0.35 | 10.0 | 1 | 1.6 | 1698 | 21.3 | 79.72 | 0.14 | 0.08 |
| 0.35 | 0.0 | 0 | 1.6 | 960 | 21.1 | 45.50 | 0.14 | 0.15 |
| 0.35 | 20.0 | 0 | 1.2 | 1742 | 21.3 | 81.78 | 0.13 | 0.07 |
| 0.35 | 30.0 | 0 | 0.8 | 1714 | 21.2 | 80.85 | 0.14 | 0.08 |
| 0.50 | 7.0 | 5 | 2.0 | 1786 | 23.1 | 77.32 | 0.15 | 0.08 |

Table 1 evidences that the addition of transition metal-based oxy compounds (or polyatomic cations comprising a transition metal and oxygen and/or hydrogen, increase both the removal rate and the RRTR values compared to solutions which do not include such compounds. This behavior is observed for all concentrations of permanganate solutions and transition metal-based oxy compounds. An increase in removal rate between 50% to greater than 100% is observed in RRTR and removal rate values when transition metal oxy compounds have been added. The FQPURR values have also found to be lower which is also more desirable when the oxy compounds (transition metal compounds that contain oxygen and an anion). If a second or more oxidizers such as potassium persulfate, cerium ammonium nitrate, hydrogen peroxide is added to the slurry solution containing permanganate and transition metal oxy compounds (containing oxygen and anion), a similar 50% to 100% enhancement in RRTR values are obtained as compared to solutions lacking the oxy compounds. The pH of such mixed oxidizer solutions can be varied from 0.5 to 5.0 and the concentration of all the mixed oxidizers typically varied from 0.01 M to 1M and the concentration of the mixed oxy compounds can range from 0.01 g/liter to 100 g/liter.

Furthermore, it has been observed that with the addition of single atoms cations (e.g., $Fe^{2+}$, $Fe^{3+}$, $Al^{3+}$, $Ni^{2+}$, $Zr^{4+}$), there is no increase in removal rate or the RRTR values. Also, with the addition of compounds of aluminum (e.g., $AlCl_3$, AlN), nitrates, chlorides and other anions, it was also found that there was no increase in the RRTR or removal rate values. This is shown in Table 2 shown below. In this experimental set, the concentration of permanganate was maintained at 0.33M and the pH of the slurry was maintained at 2.0. The CMP machine conditions were similar conditions used in Table 1. In Table 2, SAS refers to sodium alkyl sulfonate which is an anionic surfactant. It is generally desirable to replace the sodium in SAS with potassium using an ion exchange process.

TABLE 2

| Additive Type | Additive Addition (wt %) | MRR (nm/hr) | $\Delta T$ (K) | RRTR (nm/hr · K) | Surface Finish (nm) |
|---|---|---|---|---|---|
| None | 0 | 956 | 20.1 | 47.56 | 0.14 |
| Zirconium Oxy-Nitrate | 1.0% | 1756 | 20.4 | 86.08 | 0.11 |
| Zirconium Oxy-Chloride | 1.0% | 1728 | 20.3 | 85.12 | 0.12 |
| Aluminium Nitrate | 1.0% | 938 | 20.4 | 45.98 | 0.12 |
| Aluminium Chloride | 1.0% | 945 | 20.3 | 46.55 | 0.12 |

TABLE 2-continued

| Additive Type | Additive Addition (wt %) | MRR (nm/hr) | $\Delta T$ (K) | RRTR (nm/hr · K) | Surface Finish (nm) |
|---|---|---|---|---|---|
| Ferric Chloride | 1.0% | 860 | 20.6 | 41.75 | 0.13 |
| Ferric Nitrate | 1.0% | 865 | 20.5 | 42.20 | 0.13 |
| Cupric Nitrate | 1.0% | 880 | 20.5 | 42.93 | 0.14 |
| Potassium Chloride | 1.0% | 941 | 20.6 | 45.68 | 0.14 |
| Titanium oxy Sulfate | 1.0% | 1234 | 20.1 | 61.39 | 0.13 |
| Zirconium Oxy-Hydroxide | 1.0% | 982 | 20.3 | 48.37 | 0.14 |
| Manganese Chloride | 1.0% | 892 | 20.6 | 43.30 | 0.15 |
| SAS Surfactant | 1.0% | 880 | 19.0 | 46.32 | 0.12 |

Table 2 above show that only the oxy-compounds of transition metals show increased removal rates and better RRTR. All additives mentioned in the Table 2 were found to not be completely soluble in water. Potassium permanganates can be replaced with other alkali permanganate such as sodium permanganate, cesium permanganate, hydrogen permanganate, barium permanganate, or other alkali metal permanganates. The increased removal rates and RRTR values can be obtained by other oxy-additives such oxynitrate, oxy-sulfates, oxychlorides, oxysulfides, oxyhydroxides of transition metals such as zinc, titanium, zirconium, yttrium, scandium, manganese, vanadium, iron, nickel, copper, niobium, ruthenium, silver. The concentration of the compound can vary from 0.01 gm/liter to 100 gm/liter.

Example 2

The experiments in Table 1 were performed with a CAR value of 1.0. Higher removal rate values were obtained when the CAR values were reduced from 1.0 to less than 0.99. By using an ion exchange process the potassium ions in $KMnO_4$ were replaced by hydrogen resulting in decrease in the pH. By conducting ion exchange experiments, the pH of permanganate solutions was reduced from above 9.0 to between 1 and 2. This decrease in pH lead to CAR values being reduced to as low as 0.20. It should be noted that all metal cations are replaced by hydrogen the CAR value of potassium permanganate is 0.0. Similarly based on the definition of CAR herein, the CAR value of hydrogen peroxide is 0.0. Table 3 shows the removal rate and RRTR values for different CAR values. For this run the permanganate concentration was varied from 0.1M to 1.0 M, and the pH was varied from 1.0 to 4.0. Other polishing conditions were same as Example 1. An increase in removal rate and RRTR values was observed with a decrease in CAR values for different permanganate concentrations.

including (i) amorphous hydrous zirconium oxide ($ZrO_2$), $nH_2O$, (ii) amorphous zirconium hydroxide, or (iii) zirconium oxy-hydroxide. This hydrolysis reaction can also occur by heating the zirconium oxynitrate solution (without the addition of surfactant) to higher temperatures (such as between 50° C. to 110° C.).

Typically, the amorphous zirconium oxide has a porous structure (with a porosity of 5% to 80%), a rod-like shape, and a particle size ranging from 10 nm to 5000 nm, and an IEP values between 4 and 8. Due to the high porosity, the surface areas of the particles can exceed 20 $m^2/gm$ to 200 $m^2/gm$. The density of the particles varied from 1.0 to 5.5 $gm/cm^3$ due to their high porosity. More generally, in the case of abrasive oxide particles, the density of the abrasive oxide particles can be 10% to 90% of their theoretical density.

The amorphous hydrated particles in the solution were then added to 0.3 M $KMnO_4$ solution and used to polish the SiC substrate. Optionally, zirconium hydroxide or zirconium oxyhydroxide can also be added to the slurry. A SiC single crystal wafer was polished using a Buehler CMP machine at a pressure of 4 psi and 160 rpm. The removal rate and the temperature rise on the polishing pad were measured during the polishing process. The concentration of permanganate was varied from 0.01 M to 1.0 M. The pH of solution can be adjusted by adding nitric acid and/or an alkali. The pH can be varied from 0.5 to 5.0, such as between 1.5 to 4.0. The flow rate of the slurry was 30 ml/minute. The IEP of the amorphous zirconia particles in permanganate solutions kept at least for 1 hour can decrease to less than 5, such as less than 4, or less than 3.0, such as between 0.5 to 4.0.

The polishing data obtained is shown in Table 4 shown below. For these experiments the concentration of permanganate was kept constant at 0.30 M and the CAR value of the permanganate was maintained at 1.0.

TABLE 3

| KMnO4 Concentrations (M) | Zirconium Oxy-Nitrate Conc. (gm/L) | pH | CAR | MRR (nm/hr) | Temperature Rise (K) | RRTR (nm/hr · K) | Surface Finish (nm) | FQPURR (*1000) |
|---|---|---|---|---|---|---|---|---|
| 0.01 | 0.25 | 4.0 | 0.99 | 512 | 10.10 | 50.69 | 0.11 | 0.21 |
| 0.01 | 0.00 | 2.0 | 1.00 | 418 | 9.60 | 43.54 | 0.11 | 0.26 |
| 0.1 | 1.25 | 1.2 | 0.27 | 1350 | 15.00 | 90.0 | 0.12 | 0.11 |
| 0.1 | 1.00 | 1.5 | 0.68 | 1310 | 15.90 | 82.39 | 0.13 | 0.10 |
| 0.1 | 0.75 | 2.0 | 0.90 | 1295 | 15.70 | 82.48 | 0.12 | 0.09 |
| 0.2 | 0.00 | 2.0 | 1.00 | 834 | 15.50 | 53.81 | 0.13 | 0.16 |
| 0.2 | 3.00 | 1.0 | 0.50 | 1425 | 15.1 | 94.4 | 0.13 | 0.09 |
| 0.2 | 1.50 | 2.0 | 0.95 | 1438 | 18.30 | 78.58 | 0.14 | 0.10 |
| 0.2 | 1.25 | 3.0 | 1.00 | 1320 | 18.00 | 73.33 | 0.14 | 0.11 |
| 0.3 | 5.00 | 1.0 | 0.66 | 1595 | 21.40 | 74.53 | 0.14 | 0.09 |
| 0.3 | 2.50 | 1.5 | 0.89 | 1718 | 21.30 | 80.66 | 0.13 | 0.08 |
| 0.3 | 1.75 | 2.0 | 0.97 | 1672 | 20.90 | 80.00 | 0.13 | 0.08 |
| 0.35 | 0.00 | 2 | 1.00 | 984 | 20.6 | 47.77 | 0.13 | 0.13 |
| 0.35 | 0.00 | 4 | 1.00 | 858 | 20.2 | 42.48 | 0.14 | 0.16 |
| 0.5 | 5.00 | 2.0 | 0.98 | 1987 | 24.90 | 79.80 | 0.14 | 0.07 |

| Mixed Oxidizers | Zirconium Oxy-Chloride Addition (wt. %) | MRR (nm/hr) |
|---|---|---|
| 0.1M Potassium Persulfate | 0.00 | 886 |
| 0.1M Potassium Sulfate | 0.05 | 1685 |
| 0.1M Hydrogen Peroxide | 0.00 | 822 |
| 0.1M Cerium Ammonium Nitrate | 0.00 | 891 |
| 0.1M Potassium Persulfate | 0.05 | 1725 |
| 0.1M Potassium Persulfate + SAS | 0.05 | 1765 |

Example 3

This Example relates to addition of surfactants. The addition of surfactants to the slurry solution of permanganate and transition metal compounds of oxy compounds containing oxygen and anions can increase the removal rates and the RRTR values. A slurry solution was prepared by mixing zirconium oxynitrate solution with an anionic surfactant such as SAS (sodium alkyl sulfonate) and water so that the pH of the solution was between 0.5 to 3.0. The amount of anionic surfactant was varied from 0.01 gm/liter to 25 gm/liter. It was observed that the colorless solution was transformed into a slightly milky solution after the surfactant was added to it. This is because of the partial conversion of zirconium oxynitrate into one of the following compounds

TABLE 4

| Surfactant Additive | pH | MRR (nm/hr) | ΔT (K) | RRTR (nm/hr · K) | Surface Finish (nm) |
|---|---|---|---|---|---|
| None | 2 | 895 | 19 | 47.11 | 0.15 |
| SAS (0.01 wt %) | 2 | 887 | 18.8 | 47.1 | 0.13 |
| SAS (0.024 wt %) | 2 | 898 | 18.7 | 48.02 | 0.12 |
| SAS (0.06 wt %) | 2 | 882 | 17.5 | 50.4 | 0.13 |
| SAS (0.024 wt %) + Zirconium Oxychloride (0.05 wt %) | 2 | 1697 | 19.7 | 86.14 | 0.12 |
| SAS (0.024 wt %) + Zirconium Oxynitrate (0.05 wt %) | 2 | 1703 | 19.9 | 85.58 | 0.12 |
| SDS (0.2 wt %) + Zirconium Oxynitrate (0.05 wt %) | 2 | 1689 | 17.9 | 99.35 | 0.12 |
| TX-100 (0.01 wt %) + Zirconium Oxynitrate (0.05 wt %) | 2 | 1605 | 19.7 | 81.47 | 0.12 |
| C10TAB (0.2 wt %) + Zirconium Oxynitrate (0.05 wt %) | 2 | 1603 | 19.9 | 80.55 | 0.12 |
| C12TAB (0.2 wt %) + Zirconium Oxynitrate (0.05 wt %) | 2 | 1590 | 19.6 | 81.12 | 0.12 |
| C16TAB (0.2 wt %) + Zirconium Oxynitrate (0.05 wt %) | 2 | 1603 | 19.8 | 80.96 | 0.13 |
| Capstone FS-61 (0.028 wt %) + Zirconium Oxynitrate (0.05 wt %) | 2 | 1623 | 19.9 | 81.56 | 0.12 |

Table 4 shows that the removal rate, RRTR values and the FQPURR values are all enhanced by the slurry prepared by the above method. This table clearly shows two unique results being (i) the addition of the surfactant decreases the temperature rise, resulting in slightly higher RRTR values and (ii) the addition of the surfactants and transition metal oxy compounds significantly increase removal rate and reduces temperature rise, thus significantly enhancing the FFTR values. The surface finish of the SiC surface was also found to be excellent with no identified surface scratches. As the addition of certain surfactants (such as SAS) lead to formation of the hydrated oxides and hydroxide of zirconium (e.g. $ZrO_2 \cdot nH_2O$), and one can conclude that these hydrated oxides lead to the formation of scratch-free surfaces. As noted below the use of alpha alumina particles leads to the formation of scratches on the SiC surfaces. Similarly, these slurries are expected to show higher rates when polishing other types of SiC materials including (i) carbon face SiC, (ii) polycrystalline SiC, (iii) GaN, (iv) diamond, and v) graphite, as well as a wide variety of metals and non-oxide dielectrics containing nitrogen and carbon.

It is believed that the cations in the solution reside on the porous spaces of amorphous zirconium oxide or zirconium hydroxide leading to higher removal rate. The concentration of potassium permanganate can vary from 0.01M to 1.0M, the concentration of zirconium oxynitrate/oxychloride or other oxy compounds can vary from 0.01 gm/liter to 100 gm/liter, and the concentration of amorphous zirconium oxide, zirconium hydroxide and zirconium oxyhydroxide can vary from 0.0 gm/liter to 100 gm/liter. The pH of the slurry can vary from 0.5 to 4.0. The zirconium oxynitrate can be replaced with any oxynitrate, oxysulfate or oxyhydroxide compound of transition metal including but not limited to zirconium, titanium, copper with concentration varying from 0.1 gm/liter to 100 gm/liter. As noted above the surfactants can comprise as anionic, cationic or non-ionic based compounds. Mixed surfactants can also be used.

Example 4

This Example is regarding the effect of different particle abrasives. A slurry was prepared with $KMnO_4$ as the oxidizer varying in concentration from 0.01M to 0.60 M, zirconium oxynitrate, and different abrasives such as zirconia, transition metal hydroxides, silica, alumina, titania, and coated particles.

The zirconia particles may be amorphous, or crystalline (tetragonal or monoclinic). The alumina particles can be crystalline or amorphous and may contain an oxy-hydroxide phase (e.g., an AlO(OH)). All the particles can have a size varying from 10 nm to 2000 nm (2 μm). The porosity of the particles can vary from 2% to 80%, the IEP of the zirconium particles or alumina-based particles is generally less than 7, such as less than 5, or less than 4. The zirconia or the aluminum oxide or aluminum hydroxide, or aluminum oxyhydroxide particles can be coated by manganese-based oxides with thickness of the coating greater than 0.4 nm, such as greater than 10 nm or greater than 50 nm. The surface area of the particles can vary from 5 $m^2$/gm to 400 $m^2$/gm. The concentration of the particles can vary from 0.1 gm/liter to 300 gm/liter. A SiC single crystal wafer was polished using a Buehler CMP machine at a pressure of 4 psi and 160 rpm. A slurry containing different concentrations of potassium permanganate at different pH and different concentration of transition metal oxy compounds were added. This was achieved by addition of either zirconium oxychloride or zirconium oxynitrate. The concentration of either zirconium oxychloride or zirconium oxynitrate was varied from 0.01 gm/liter to 100 gm/liter.

The removal rate and the temperature rise on the pad was measured during the polishing process. The concentration of permanganate was varied from 0.01 M to 0.40 M, while the concentration of polyatomic zirconium cations was varied from 0.001 M to 0.1 M. The polyatomic zirconium cations were supplied by either adding zirconium oxychloride or zirconium oxynitrate in the solutions. The pH of solution can be adjusted by adding nitric acid and/or an alkali. The pH can be varied from 0.5 to 5.0, such as between 1.5 to 4.0. The flow rate of the slurry was 30 ml/minute.

Table 5 shows the data obtained from the experimental runs. The concentration of the particles was 1 weight percent for generating the data in this Table. For these experiments the concentration of the abrasive particles was varied from 0.1 to 20 weight percent.

TABLE 5

| $KMnO_4$ Conc. (M) | Zirconium Oxy-Nitrate Conc. (gm/l) | pH | Particle Type | Particle Nature | MRR (nm/hr) | ΔT (K) | RRTR (nm/hr · K) |
|---|---|---|---|---|---|---|---|
| 0.3 | 2.00 | 2.0 | Hydrous zirconia ($ZrO_2 \cdot nH_2O$) | Amorphous | 1778 | 20.4 | 87.16 |
| 0.1 | 0.50 | 2.0 | Hydrous Zirconia ($ZrO_2 \cdot nH_2O$) | Amorphous | 1256 | 18.6 | 67.53 |

TABLE 5-continued

| KMnO$_4$ Conc. (M) | Zirconium Oxy-Nitrate Conc. (gm/l) | pH | Particle Type | Particle Nature | MRR (nm/hr) | ΔT (K) | RRTR (nm/hr · K) |
|---|---|---|---|---|---|---|---|
| 0.3 | 2.00 | 2.0 | 200 nm Alumina | Amorphous | 1638 | 19.9 | 82.31 |
| 0.1 | 2.00 | 2.0 | Zirconia (180 nm) | Crystalline | 1288 | 18.8 | 68.51 |
| 0.3 | 2.00 | 2.0 | Alumina Coated Titania | Amorphous | 1588 | 19.8 | 80.20 |
| 0.3 | 2.00 | 2.0 | Silica Coated Titania | Amorphous | 1547 | 20.1 | 76.97 |
| 0.3 | 5.00 | 1.5 | Zirconia (200 nm) | Crystalline | 1968 | 19.1 | 103 |
| 0.3 | 2.00 | 2.0 | Zirconia (100 nm) | Crystalline | 1742 | 20.5 | 84.98 |
| 0.3 | 1.25 | 4.0 | Zirconia | Crystalline | 1623 | 20.4 | 79.56 |
| 0.3 | 2.00 | 2.0 | Manganese Oxide Coated Alumina | — | 1512 | 20.1 | 75.22 |
| 0.3 | 2.00 | 2.0 | Manganese Oxide Coated Zirconia | — | 1698 | 20.8 | 81.63 |
| 0.3 | 2.00 | 2.0 | Manganese Oxide Coated Silica | — | 1592 | 20.5 | 77.66 |
| 0.3 | 2.00 | 2.0 | 500 nm Zirconia | Crystalline | 1814 | 20.9 | 86.79 |
| 0.3 | 2.00 | 2.0 | Diamond* | Crystalline | 2796 | 19.9 | 90.25 |
| 0.1 | 5.00 | 1.5 | Diamond + Alumina* | Crystalline | 5232 | 15.8 | 331 |
| 0.3 | 3.00 | 1.5 | Diamond + Alumina* | Crystalline | 7501 | 15.3 | 490.26 |

(*indicates the presence of scratches on the polished surface)

The results in Table 5 clearly evidences that the removal rates and the RRTR values significantly improve with the addition of particles to the slurry as compared to when oxy compounds were not added. The manganese oxide coated particles (of silica, zirconia, or alumina) were found to generate less scratches as compared to uncoated particles. The coated particles showed an IEP values of less than 5.0.

Table 6 shows the characteristics of different abrasives used in the slurry. The chemical composition of this slurry included permanganate concentration of 0.3 M, and 0.5 weight percent of zirconium oxynitrate solution. The abrasive particle content was varied from 0.1% to 15 percent, however for Table 6, the content was 1 weight %. The various average size range of the abrasive particles that were tested are shown in the table, but the results are quoted for values indicated in the brackets. All these abrasive particles gave high RRTR values, however the slurries containing hydrous oxides and monoclinic zirconia have the lowest average surface scratches for these runs. The IEP of all the particles was found to be less than 5 due to the in-situ (or ex-situ) coating for the particles with a manganese oxide coating. All slurry particles mentioned in Table 6 have Mohs hardness greater than 5.

An interesting result was recognized when using nanosize diamond particles (particle size 5 nm to 1 micron) and a combination of diamond (size 5 nm to 1 micron) and alumina (size 0.4 micron to 30 microns) for polishing of SiC samples (shown in Table 6). The weight ratio of diamond to alumina can be varied from 1:2 to 1:50. The temperature rise as well as the removal rate was found to be much higher giving rise to very high RRTR values with lower temperature rise. The diamond polishing samples showed a relatively high degree of scratches.

TABLE 6

| Particle Type | Size (nm) | Surface Charge (IEP) | Porosity | Phase | Removal rate (nm/hr) |
|---|---|---|---|---|---|
| Hydrous Zirconia (ZrO2·nH2O) | 200-500 (400) | 0.5-3.0 | ~60% | Amorphous | 1778 |
| Zirconia | 5-200 (60) | 2 | 10-20% | Monoclinic | 1672 |
| Zirconia | 100-500 (180) | 2.0-5.0 | — | Tetragonal | 1754 |
| Manganese Oxide coated Zirconia | 70-250 (180) | 0.5-3.0 | — | Monoclinic | 1712 |
| Alumina | 30-500 (80) | 2.0-5.0 | — | Alpha/gamma | 1689 |
| Alumina Coated Titania | 100-400 (200) | 5.0 | — | — | 1648 |
| Manganese Oxide Coated Silica | 50-200 (130) | 0.5-5.0 | — | — | 1587 |

Example 5

The addition of surfactants and transition metal oxy compounds for extended periods of time in the permanganate slurry can cause a chemical breakdown of the oxidizer which can result in a decrease in the polishing rate. Table 7 below shows the time dependent removal rate of a slurry mixed with two components. The first component contained 0.30 M permanganate solution and the second component contained 1 zirconia particles, 20 mM per liter zirconium oxynitrate, and 2 gm/liter of the surfactant SDS. These two components were mixed, and the removal rate was measured as a function of time (a time of 0 days to 60 days), with the resulting data shown in Table 7.

TABLE 7

| Slurry Pot Life (days) | Removal Rate (nm/hr) |
|---|---|
| 0.0 | 1695 |
| 0.1 | 1692 |
| 0.2 | 1690 |
| 0.5 | 1707 |
| 1.0 | 1697 |
| 2.0 | 1725 |
| 3.0 | 1722 |
| 7.0 | 1701 |
| 14.0 | 1687 |
| 21.0 | 1606 |
| 28.0 | 1495 |
| 60.0 | 930 |

Table 7 evidences that for the first few days the removal rate is constant but starts to decrease after 15 days rather rapidly. This has been attributed to the breakdown of the permanganate-based oxidizer. To mitigate this effect, as described above, the slurry can be divided into two components as shown in FIG. 2 and used for CMP generally within 7 days after mixing of the components.

Example 6

This Example is regarding the polishing of other materials. Different materials and surfaces were polished (e.g., C-face SiC, polycrystalline SiC, and Ga-face GaN). The CMP removal rates for all these surfaces were found to increase from 10 percent to slightly less than 100 percent as compared to when no transition metal oxy compounds were added to the slurries.

Example 7

The polishing composition was prepared by mixing an oxidizer solution comprising of 5.5 wt. % $KMnO_4$ which is about 4.5 folds of the POU with about 1.3 wt. % Zirconium Oxy-Nitrate solution. This Zirconium Oxy-Nitrate solution also adjusts the pH of the slurry to the operating pH (about pH 2). The mixing ratio of the oxidizer solution to the Zirconium Oxy-Nitrate solution was about 10:1. With this polishing composition, the experiments were performed on a tabletop polisher having a 12" platen size, with a downforce of 34.47 kPa and platen speed of 300 RPM. A soft polyurethane pad with Shore A hardness of 67 was used for the experimental data mentioned in table 1, 2 & 4. The slurry flow rate used is 30 mL/min for 2"×2" coupons.

TABLE 8

Abrasive-free polishing

| $KMnO_4$ Conc. (M) | Zirconium Oxy-Nitrate (gm/L) | Zirconium Oxy-Chloride (gm/L) | pH | C-Film MRR (nm/min) | Surface Finish (nm) |
|---|---|---|---|---|---|
| 0.001 | 0.0 | 0.2 | 2.0 | 98 | 0.14 |
| 0.01 | 0.3 | 0 | 2.0 | 144 | 0.13 |
| 0.05 | 0.0 | 0 | 1.0 | 128 | 0.12 |
| 0.05 | 0.3 | 0 | 1.5 | 386 | 0.11 |
| 0.05 | 0.0 | 2 | 2.6 | 426 | 0.13 |
| 0.20 | 0.0 | 0 | 2.0 | 358 | 0.14 |
| 0.20 | 2.0 | 0 | 2.0 | 675 | 0.13 |
| 0.20 | 2.0 | 0 | 4.0 | 574 | 0.13 |
| 0.20 | 0.0 | 0 | 9.0 | 98 | 0.14 |
| 0.35 | 10.0 | 1 | 1.6 | 1000 | 0.14 |
| 0.35 | 0.0 | 0 | 1.6 | 440 | 0.14 |
| 0.35 | 20.0 | 0 | 1.2 | 1098 | 0.13 |
| 0.35 | 30.0 | 0 | 0.8 | 1023 | 0.14 |
| 0.50 | 7.0 | 5 | 2.0 | 1200 | 0.15 |

TABLE 8

Abrasive polishing

| $KMnO_4$ Conc. (M) | Zirconium Oxy-Nitrate (gm/l) | pH | Particle Type | Particle Nature | C-Film MRR (nm/min) |
|---|---|---|---|---|---|
| 0.01 | 0.30 | 1.8 | Zirconia (100 nm) | Crystalline | 186 |
| 0.05 | 0.50 | 2.0 | Zirconia (100 nm) | Crystalline | 421 |
| 0.3 | 2.00 | 2.0 | Hydrous zirconia ($ZrO_2 \cdot nH_2O$) | Amorphous | 1119 |
| 0.1 | 0.50 | 2.0 | Hydrous Zirconia ($ZrO_2 \cdot nH_2O$) | Amorphous | 557 |
| 0.3 | 2.00 | 2.0 | 200 nm Alumina | Amorphous | 1030 |
| 0.1 | 2.00 | 2.0 | Zirconia (180 nm) | Crystalline | 582 |
| 0.3 | 2.00 | 2.0 | Alumina Coated Titania | Amorphous | 1030 |
| 0.3 | 2.00 | 2.0 | Silica Coated Titania | Amorphous | 1164 |
| 0.3 | 5.00 | 1.5 | Zirconia (200 nm) | Crystalline | 1224 |
| 0.3 | 2.00 | 2.0 | Zirconia (100 nm) | Crystalline | 1179 |
| 0.3 | 1.25 | 4.0 | Zirconia | Crystalline | 731 |
| 0.3 | 2.00 | 2.0 | Manganese Oxide Coated Alumina | — | 1239 |
| 0.3 | 2.00 | 2.0 | Manganese Oxide Coated Zirconia | — | 1269 |
| 0.3 | 2.00 | 2.0 | Manganese Oxide Coated Silica | — | 1104 |
| 0.3 | 2.00 | 2.0 | 500 nm Zirconia | Crystalline | 1015 |
| 0.3 | 2.00 | 2.0 | Diamond* | Crystalline | 1433 |
| 0.1 | 5.00 | 1.5 | Diamond + Alumina* | Crystalline | 2239 |
| 0.3 | 3.00 | 1.5 | Diamond + Alumina* | Crystalline | 2687 |

*indicates scratches on film surface

TABLE 9

Effect of variation in the pad material

| Pad Type | Pad Hardness | pH | C-Film MRR (nm/min) |
|---|---|---|---|
| Polyurethane pad | Shore D 65 | 1.0 | 478 |
| Polyurethane pad | Shore D 58 | 1.5 | 507 |
| Polyurethane pad | Shore D 58 | 2.6 | 418 |
| Polyurethane pad | Shore D 65 | 4.0 | 299 |
| Polyurethane pad | Shore D 65 | 9.0 | 149 |
| Polyurethane pad (with in-situ transition metal like Mn2 + coating) | Shore D 35 | 2 | 806 |
| Polyurethane pad (with in-situ transition metal like Mn2 + coating) | Shore D 35 | 1.6 | 746 |
| Polyurethane pad (with in-situ transition metal like Mn2 + coating) | Shore A 67 | 2 | 1045 |
| Polyurethane pad (with in-situ transition metal like Mn2 + coating) | Shore A 67 | 1.2 | 989 |
| Polyurethane pad (with in-situ transition metal like Mn2 + coating) | Shore A 67 | 0.5 | 970 |

TABLE 10

Effect of variation in Oxidizer on film removal rate

| Oxidizer Type | Oxidizer Conc. (Wt. %) | Zirconium Oxy-Nitrate (gm/L) | pH | C-Film MRR (nm/min) |
|---|---|---|---|---|
| Potassium Permanganate | 5.5 | 1.5 | 2 | 1000 |
| Potassium Permanganate | 4 | 1.2 | 2.4 | 896 |
| Potassium Permanganate | 3.6 | 1.5 | 2 | 836 |
| Potassium Permanganate | 1.2 | 1.5 | 2 | 498 |
| Potassium Permanganate | 0.6 | 0.8 | 2.8 | 382 |
| Potassium Persulfate | 1 | 1.2 | 2 | 102 |
| Potassium Persulfate | 2.2 | 1.2 | 2 | 155 |
| Potassium Persulfate | 0.5 | 0.8 | 2.4 | 71 |
| Potassium Periodate | 0.2 | 0.4 | 1.8 | 60 |
| Potassium Periodate | 0.8 | 0.8 | 2 | 90 |
| Potassium Permanganate + Potassium Persulfate | 2 (1.2 + 0.8) | 1.5 | 2 | 476 |

Figure 3:
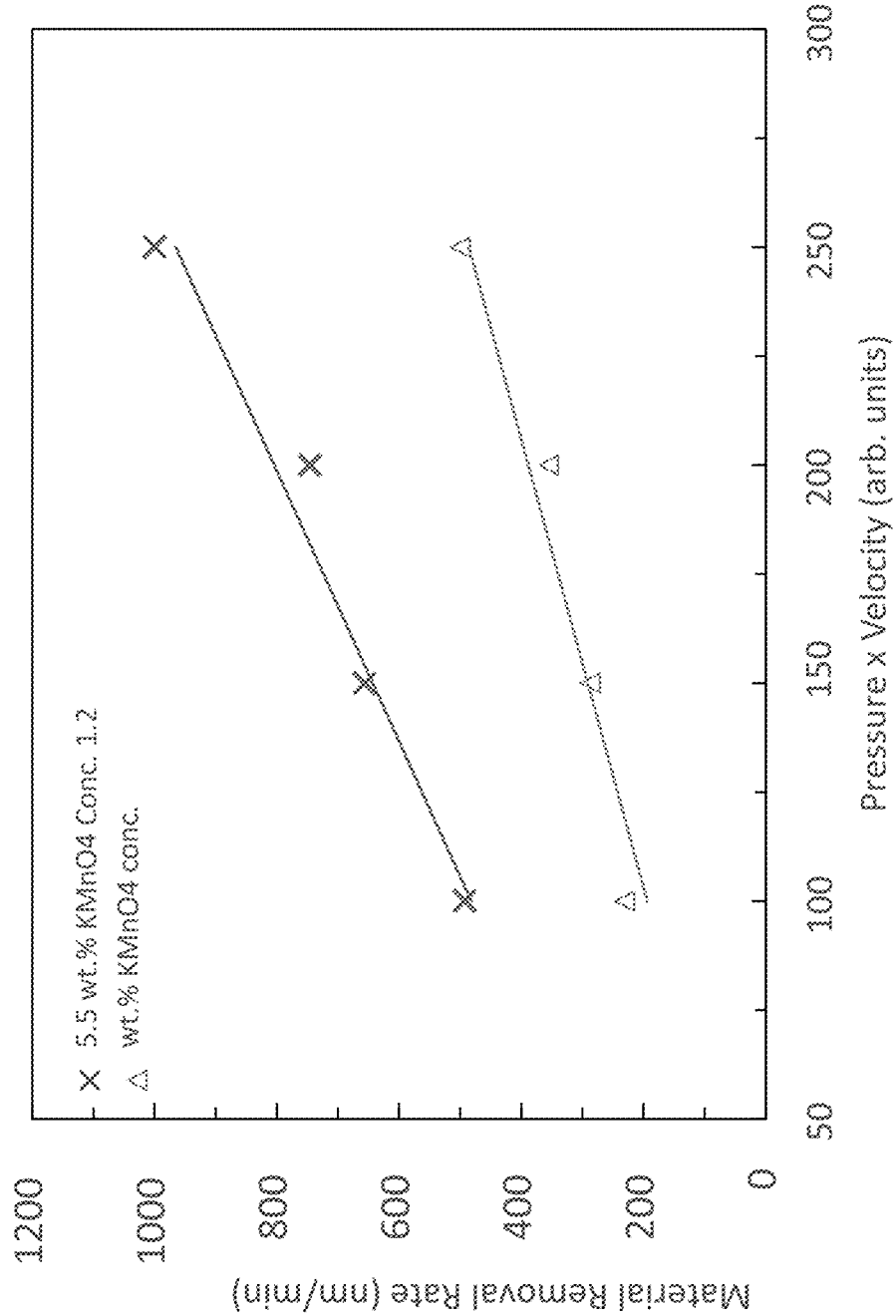
FIG. 3 is a graph of material removal rate (nm/minute) versus pressure times velocity, comparing concentrations of potassium permanganate at 5.5 and 1.2 weight percent.

Referring to FIG. 3 below, the two compositions are as set forth below:

A. (Represented by "X" data points):
   a. 5.5 weight percent of potassium permanganate;
   b. 1.3 weight percent of zirconium oxynitrate
B. (Represented by "triangle" data points):
   a. 1.2 weight percent of potassium permanganate;
   b. 1.3 weight percent of zirconium oxynitrate.

In these compositions, the final pH for A and B was about 2. The pot life of the fully formulated slurry composition was found to extend beyond seven days.

ASPECTS OF THE INVENTION

In a first aspect, the invention provides a slurry for chemical mechanical polishing (CMP), comprising
an aqueous liquid carrier;
c. a transition metal oxy compound chosen from oxy-nitrates, oxy-chlorides, oxy-sulfates, oxy-carbonates, and $C_2$-$C_{10}$ oxy-alkanoates; and
a per-based oxidizer.

In a second aspect, the invention provides the slurry of the first aspect, wherein the slurry comprises the oxygen and anion containing transition metal compound, and wherein the anion comprises oxynitrate, oxychloride, oxyhydroxide, or oxysulfate.

In a third aspect, the invention provides the slurry of the first or second aspect, wherein the per-based oxidizer has a cation to anion ratio (CAR) value varying between 0.0 to 1.0.

In a fourth aspect, the invention provides a slurry comprising
a. water;
b. a per-based oxidizer; and
c. at least one compound which forms a cation in solution chosen from $ZrO+$, $NiO^+$, $ZrOH^+$, $HfO^+$, $Hf^{OH}+$, $TiO^+$, and $TiO^{++}$; and
wherein the pH is about 1 to about 5.

In a fifth aspect, the invention provides the slurry of the first or fourth aspects, wherein the per-based oxidizer is chosen from potassium permanganate and sodium permanganate.

In a sixth aspect, the invention provides the slurry of the fourth or fifth aspects, wherein c. is chosen from zirconium oxynitrate, zirconium oxychloride, nickel oxynitrate, nickel oxychloride, hafnium oxynitrate, hafnium oxychloride, and zirconium $C_2$-$C_{10}$ oxy-alkanoates.

In a seventh aspect, the zirconium $C_2$-$C_{10}$ oxy-alkanoate is zirconium oxy-acetate.

In an eight aspect, the invention provides the slurry of the any of the first through seventh aspects, further comprising abrasive oxide particles comprising at least one of zirconia, silica, alumina-ceria, hydrated metal oxide, manganese oxide coated particles, and alumina.

In a ninth aspect, the invention provides any one of the first through eighth aspects, further comprising at least one surfactant.

In a tenth aspect, the surfactant of the ninth aspect is a fluorine containing surfactant or a surfactant containing at least 8 carbon atoms, wherein the surfactant is present in a concentration from 0.1 gm/liter to 10 gm/liter.

In an eleventh aspect, the invention provides the slurry of the first aspect, wherein the slurry comprises the polyatomic cations, and wherein the concentration of the polyatomic cations is 0.01 gm/liter to 20 gm/liter.

In a twelfth aspect, the invention provides the slurry of the first aspect, wherein the slurry comprises the oxygen and anion containing transition metal compound, and wherein the oxygen and anion containing transition metal compound is chosen from zirconium oxynitrate, zirconium oxychloride, nickel oxynitrate, nickel oxychloride, hafnium oxynitrate, hafnium oxychloride, and zirconium $C_2$-$C_{10}$ oxy-alkanoates.

In a thirteenth aspect, the invention provides the slurry of any one of the first twelve aspects, wherein the per-based oxidizer comprises a permanganate compound in a concentration from 0.01 M to 0.5 M.

In a fourteenth aspect, the invention provides the slurry of the eighth aspect, wherein a concentration of abrasive oxide particles is from about 0.001 to about 3% by weight.

In a fifteenth aspect, the invention provides the slurry of the eighth or fourteenth aspects, wherein the abrasive oxide particles comprise zirconia or alumina, and has an isoelectric point (IEP) value of 0.5 to 4.0.

In a sixteenth aspect, the invention provides the slurry of the eight, fourteenth, or fifteenth aspects, wherein a density of the abrasive oxide particles is 10% to 90% of a theoretical density of the abrasive oxide particles.

In a seventeenth aspect, the invention provides a method of chemical mechanical polishing (CMP) a substrate, comprising:
providing a slurry, comprising:
   a first component including an aqueous liquid carrier and at least one per-based oxidizer, and
   a second component comprising (i) an aqueous carrier and an oxygen and anion transition metal compound or (ii) a precursor to polyatomic cations comprising a transition metal and oxygen or hydrogen; or (iii) a transition metal oxy compound chosen from oxy-nitrates, oxy-chlorides, oxy-sulfates, oxy-carbonates, and $C_2$-$C_{10}$ oxy-alkanoates;
mixing the first and second components to form the slurry;
using a CMP apparatus to expose the substrate against a polishing pad on which the slurry is fed to remove at least a portion of a surface of the substrate.

In an eighteenth aspect, the invention provides the method of the seventeenth aspect, wherein the slurry comprises:
a. water;
b. a per-based oxidizer; and
c. at least one compound which forms a cation in solution chosen from $ZrO+$, $ZrO^{++}$, $NiO^+$, $ZrOH^+$, $HfO^+$, $HfOH^+$, $TiO^+$, and $TiO^{++}$; and
wherein the pH is about 1 to about 5.

In a nineteenth aspect, the invention provides the method of the seventeenth or eighteenth aspects, wherein the per-based oxidizer is chosen from potassium permanganate and sodium permanganate.

In a twentieth aspect, the invention provides the method of the nineteenth aspect, wherein the per-based oxidizer comprises permanganate that has a cation to anion ratio (CAR) value from 0.3 to 1.0, in a concentration in the slurry of 0.01 M to 0.5 M.

In a twenty-first aspect, the invention provides the method of the twentieth aspect, further comprising processing the per-based oxidizer to provide the CAR value using a cation replacing process comprises ion exchange, electrodialysis, or reverse osmosis.

In a twenty-second aspect, the invention provides the method of any one of the methods of any one of the seventeenth through twenty-first aspects, wherein the substrate comprises silicon carbide, gallium nitride, or diamond.

In a twenty-third aspect, the invention provides the method of any one of the seventeenth through twenty-first aspects, wherein the substrate comprises wherein the substrate comprises amorphous carbon.

In a twenty-fourth aspect, the invention provides the method of any one of the seventeenth through twenty-third aspects, wherein the first or second components further comprise oxide abrasive particles comprising at least one of zirconia, silica, alumina-ceria, hydrated metal oxide, manganese oxide coated particles and alumina.

In a twenty-fifth aspect, the invention provides the method of the twenty-fourth aspect, wherein the oxide abrasive particles have an isoelectric point (IEP) value of 0.5 to 4.0.

In a twenty-sixth aspect, the invention provides the method of twenty-fourth or twenty-fifth aspects, wherein the oxide abrasive particles comprise zirconia particles that are amorphous, monocline or tetragonal, and that have a surface area of 20 $m^2$/gm to 400 $m^2$/gm.

In a twenty-seventh aspect, the invention provides the method of any one of the seventeenth through the twenty sixth aspects, wherein the substrate comprises a silicon carbide single crystal.

In a twenty-eight aspect, the invention provides the method of any one of the seventeenth through twenty-seventh aspects, wherein the first component or the second component further comprises a surfactant that includes fluorine or has at least 8 carbon atoms, and wherein the surfactant is in a concentration from 0.1 gm/liter to 10 gm/liter.

In a twenty-eighth aspect, the invention provides the method of any one of the seventeenth through the twenty-seventh aspects, wherein the polishing pad is a soft polyurethane pad having a shore A hardness of about 60-70 or Shore D hardness of about 30-40.

In a twenty-ninth aspect, the invention provides a slurry for chemical mechanical polishing (CMP), comprising
an aqueous liquid carrier;
an additive including either an oxygen and anion containing transition metal compound; or polyatomic cations comprising a transition metal and oxygen or hydrogen; and
a per-based oxidizer.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A slurry for chemical mechanical polishing (CMP), comprising:
   an aqueous liquid carrier;
   a transition metal oxy compound chosen from oxy-nitrates, oxy-chlorides, oxysulfates, oxy-carbonates, and C2-C10 oxy-alkanoates; and
   a per-based oxidizer, wherein the per-based oxidizer has a cation to anion ratio (CAR) value varying between 0.0 to 1.0; further comprising from about 0.001 to about 3% by weight abrasive oxide particles, wherein the abrasive oxide particles comprise zirconia or alumina, and has an isoelectric point (IEP) value of 0.5 to 4.0.

2. The slurry of claim 1, comprising
   a) water;
   b) a per-based oxidizer; and
   c) at least one compound which forms a cation in solution chosen from ZrO+, ZrO++, NiO+, ZrOH+, HfO+, HfOH+, TiO+, and TiO++; and
   wherein the pH is about 1 to about 5.

3. The slurry of claim 1, wherein the per-based oxidizer is chosen from potassium permanganate and sodium permanganate.

4. The slurry of claim 2, wherein the slurry comprises c) and is chosen from zirconium oxynitrate, zirconium oxychloride, nickel oxynitrate, nickel oxychloride, hafnium oxynitrate, hafnium oxychloride, and zirconium C2-C10 oxy-alkanoates.

5. The slurry of claim 1, further comprising at least one surfactant.

6. The slurry of claim 1, wherein the slurry comprises the polyatomic cations, and wherein the concentration of the polyatomic cations is 0.01 gm/liter to 20 gm/liter.

7. The slurry of claim 1, wherein the slurry comprises c) and is chosen from zirconium oxynitrate, zirconium oxychloride, nickel oxynitrate, nickel oxychloride, hafnium oxynitrate, hafnium oxychloride, and zirconium C2-C10 oxy-alkanoates.

8. The slurry of claim 2, wherein the per-based oxidizer comprises a permanganate compound in a concentration from 0.01 M to 0.5 M.

9. The slurry of claim 1, wherein a density of the abrasive oxide particles is 10% to 90% of a theoretical density of the abrasive oxide particles.

* * * * *